(12) United States Patent
Kellogg et al.

(10) Patent No.: US 8,485,128 B2
(45) Date of Patent: Jul. 16, 2013

(54) MOVABLE GROUND RING FOR A PLASMA PROCESSING CHAMBER

(75) Inventors: Michael C. Kellogg, Oakland, CA (US); Alexei Marakhtanov, Albany, CA (US); Rajinder Dhindsa, San Jose, CA (US)

(73) Assignee: Lam Research Corporation, Fremont, CA (US)

( * ) Notice: Subject to any disclaimer, the term of this patent is extended or adjusted under 35 U.S.C. 154(b) by 291 days.

(21) Appl. No.: 12/828,120

(22) Filed: Jun. 30, 2010

(65) Prior Publication Data

US 2012/0003836 A1    Jan. 5, 2012

(51) Int. Cl.
*H01L 21/3065* (2006.01)
*C23F 1/08* (2006.01)
*C23C 14/34* (2006.01)
*C23C 16/00* (2006.01)

(52) U.S. Cl.
USPC .......... 118/723 I; 118/728; 156/345.48; 204/298.23

(58) Field of Classification Search
USPC ............ 204/298.23; 118/723 E, 723 I, 728
See application file for complete search history.

(56) References Cited

U.S. PATENT DOCUMENTS

| | | | |
|---|---|---|---|
| 4,340,462 A | 7/1982 | Koch | |
| 4,948,458 A | 8/1990 | Ogle | |
| 5,200,232 A | 4/1993 | Tappan et al. | |
| 5,796,066 A | 8/1998 | Guyot | |
| 5,820,723 A | 10/1998 | Benjamin et al. | |
| 5,824,605 A | 10/1998 | Chen et al. | |
| 5,885,423 A | 3/1999 | Guyot | |
| 5,948,704 A | 9/1999 | Benjamin et al. | |
| 6,013,155 A | 1/2000 | McMillin et al. | |
| 6,090,304 A | 7/2000 | Zhu et al. | |
| 6,140,612 A | 10/2000 | Husain et al. | |
| 6,230,651 B1 | 5/2001 | Ni et al. | |
| 6,333,272 B1 | 12/2001 | McMillin et al. | |
| 6,824,627 B2 | 11/2004 | Dhindsa et al. | |
| 6,847,014 B1 | 1/2005 | Benjamin et al. | |
| 7,161,121 B1 | 1/2007 | Steger | |
| 7,743,730 B2 | 6/2010 | Kholodenko et al. | |
| 2004/0000375 A1 | 1/2004 | Liu et al. | |
| 2008/0149596 A1 | 6/2008 | Dhindsa et al. | |
| 2009/0173389 A1* | 7/2009 | Fischer | 137/2 |
| 2009/0200269 A1* | 8/2009 | Kadkhodayan et al. | 216/71 |
| 2010/0040768 A1 | 2/2010 | Dhindsa et al. | |
| 2010/0044974 A1 | 2/2010 | Kenworthy et al. | |
| 2010/0108261 A1 | 5/2010 | Augustino et al. | |
| 2010/0154709 A1* | 6/2010 | Fischer et al. | 118/723 I |

OTHER PUBLICATIONS

Commonly Owned U.S. Utility Patent U.S. Appl. No. 12/872,980, filed Aug. 31, 2010.
Commonly Owned U.S. Utility Patent U.S. Appl. No. 12/872,982, filed Aug. 31, 2010.
Commonly Owned U.S. Utility Patent U.S. Appl. No. 12/872,984, filed Aug. 31, 2010.
Search and Examination Report mailed Feb. 17, 2012 for Corres. Singapore Appln. No. 201103946-8.

* cited by examiner

*Primary Examiner* — Parviz Hassanzadeh
*Assistant Examiner* — Nathan K Ford
(74) *Attorney, Agent, or Firm* — Buchanan Ingersoll & Rooney PC

(57) ABSTRACT

A movable ground ring of a movable substrate support assembly is described. The movable ground ring is configured to fit around and provide an RF return path to a fixed ground ring of the movable substrate support assembly in an adjustable gap capacitively-coupled plasma processing chamber wherein a semiconductor substrate supported in the substrate support assembly undergoes plasma processing.

20 Claims, 12 Drawing Sheets

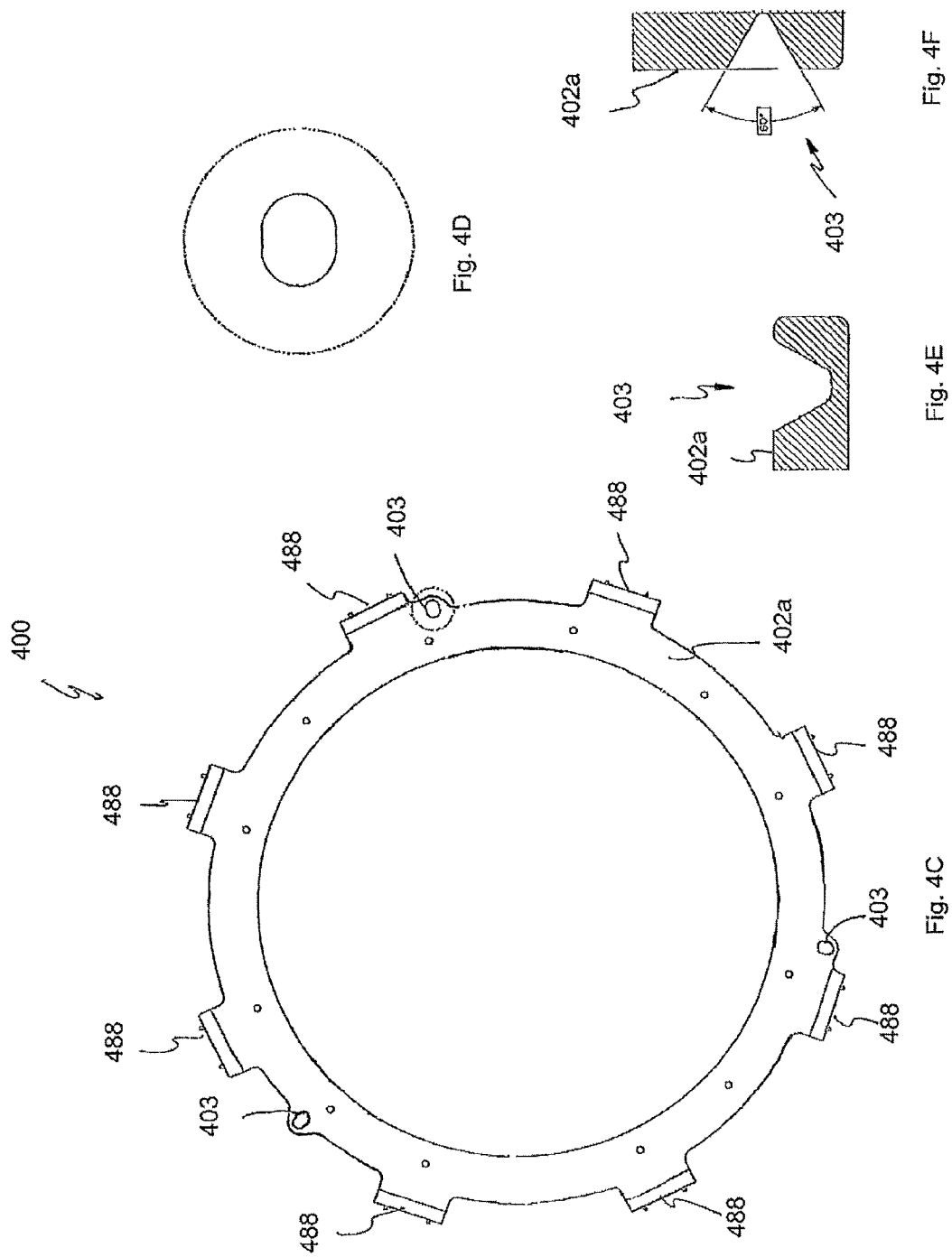

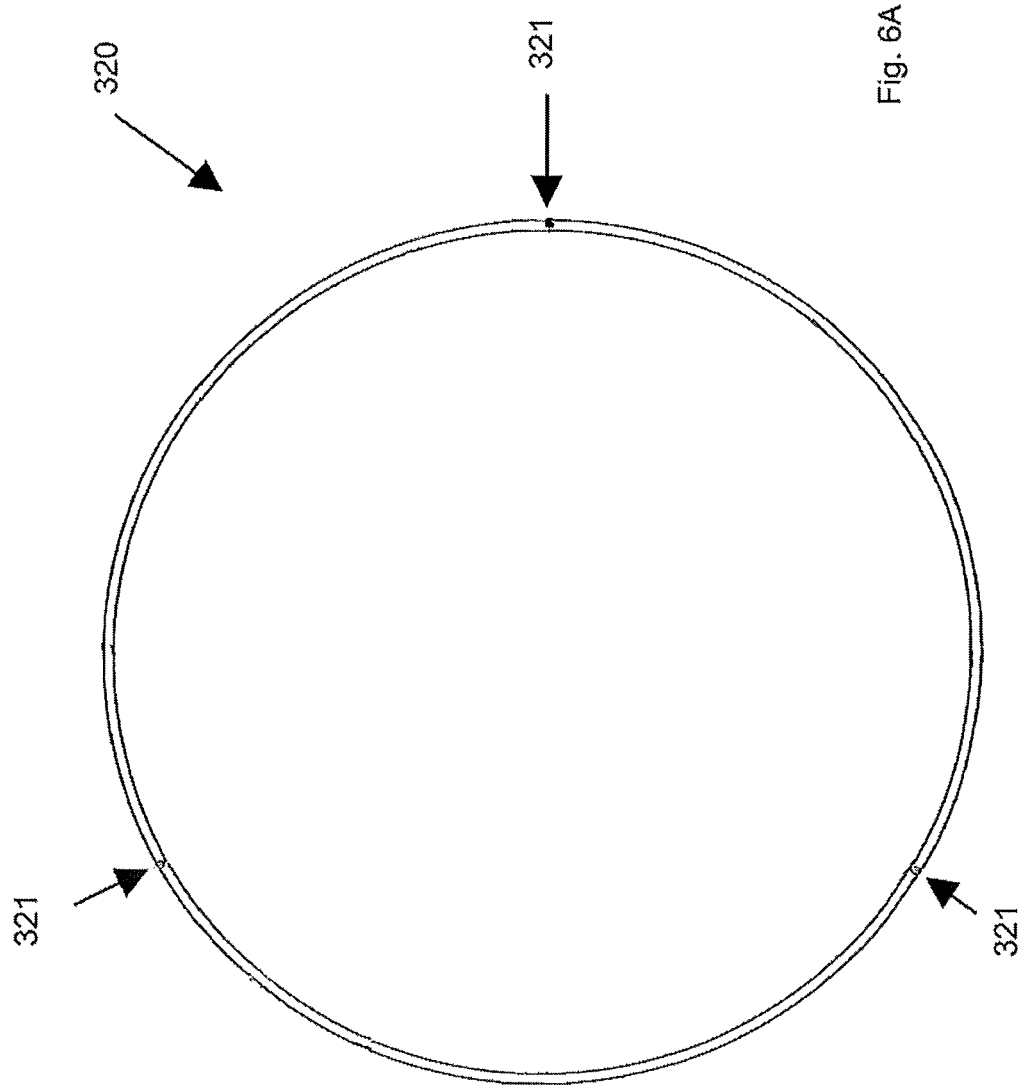

MOVABLE GROUND RING FOR A PLASMA PROCESSING CHAMBER

BACKGROUND

With each successive semiconductor technology generation, wafer diameters tend to increase and transistor sizes decrease, resulting in the need for an ever higher degree of accuracy and repeatability in substrate processing. Semiconductor substrate materials, such as silicon wafers, are routinely processed using plasma processing chambers. Plasma processing techniques include sputter deposition, plasma-enhanced chemical vapor deposition (PECVD), resist strip, and plasma etch. Plasma can be generated by subjecting suitable process gases in a plasma processing chamber to radio frequency (RF) power. Flow of RF current in the plasma processing chamber can affect the processing.

A plasma processing chamber can rely on a variety of mechanisms to generate plasma, such as inductive coupling (transformer coupling), helicon, electron cyclotron resonance, capacitive coupling (parallel plate). For instance, high density plasma can be produced in a transformer coupled plasma (TCP™) processing chamber, or in an electron cyclotron resonance (ECR) processing chamber. Transformer coupled plasma processing chambers, wherein RF energy is inductively coupled into the chambers, are available from Lam Research Corporation, Fremont, Calif. An example of a high-flow plasma processing chamber that can provide high density plasma is disclosed in commonly-owned U.S. Pat. No. 5,948,704, the disclosure of which is hereby incorporated by reference. Parallel plate plasma processing chambers, electron-cyclotron resonance (ECR) plasma processing chambers, and transformer coupled plasma (TCP™) processing chambers are disclosed in commonly-owned U.S. Pat. Nos. 4,340,462; 4,948,458; 5,200,232 and 5,820,723, the disclosures of which are hereby incorporated by reference.

By way of example, plasma can be produced in a parallel plate processing chamber such as the dual frequency plasma etching chamber described in commonly-owned U.S. Pat. No. 6,090,304, the disclosure of which is hereby incorporated by reference. A preferred parallel plate plasma processing chamber is a dual frequency capacitively coupled plasma processing chamber including an upper showerhead electrode and a substrate support. For purposes of illustration, embodiments herein are described with reference to a parallel plate type plasma processing chamber.

A parallel plate plasma processing chamber for plasma etching is illustrated in FIG. 1. The plasma processing chamber 100 comprises a chamber 110, an inlet load lock 112, and an optional outlet load lock 114, further details of which are described in commonly-owned U.S. Pat. No. 6,824,627, which is hereby incorporated by reference in its entirety.

The load locks 112 and 114 (if provided) include transfer devices to transfer substrates such as wafers from a wafer supply 162, through the chamber 110, and out to a wafer receptacle 164. A load lock pump 176 can provide a desired vacuum pressure in the load locks 112 and 114.

A vacuum pump 172 such as a turbo pump is adapted to maintain a desired pressure in the chamber 110. During plasma etching, the chamber pressure is controlled, and preferably maintained at a level sufficient to sustain a plasma. Too high a chamber pressure can disadvantageously contribute to etch stop while too low a chamber pressure can lead to plasma extinguishment. In a medium density plasma processing chamber, such as a parallel plate plasma processing chamber, preferably the chamber pressure is maintained at a pressure below about 200 mTorr (e.g., less than 100 mTorr such as 20 to 50 mTorr) ("about" as used herein means±10%).

The vacuum pump 172 can be connected to an outlet in a wall of the chamber 110 and can be throttled by a valve 173 in order to control the pressure in the chamber. Preferably, the vacuum pump is capable of maintaining a pressure within the chamber 110 of less than 200 mTorr while etching gases are flowed into the chamber 110.

The chamber 110 includes an upper electrode assembly 120 including an upper electrode 125 (e.g., showerhead electrode), and a substrate support 150. The upper electrode assembly 120 is mounted in an upper housing 130. The upper housing 130 can be moved vertically by a mechanism 132 to adjust the gap between the upper electrode 125 and the substrate support 150.

A process gas source 170 can be connected to the housing 130 to deliver process gas comprising one or more gases to the upper electrode assembly 120. In a preferred plasma processing chamber, the upper electrode assembly comprises a gas distribution system, which can be used to deliver process gas to a region proximate to the surface of a substrate. Gas distribution systems, which can comprise one or more gas rings, injectors and/or showerheads (e.g., showerhead electrodes), are disclosed in commonly-owned U.S. Pat. Nos. 6,333,272; 6,230,651; 6,013,155 and 5,824,605, the disclosures of which are hereby incorporated by reference.

The upper electrode 125 preferably comprises a showerhead electrode, which includes gas holes (not shown) to distribute process gas therethrough. The gas holes can have a diameter of 0.02 to 0.2 inch. The showerhead electrode can comprise one or more vertically spaced-apart baffle plates that can promote the desired distribution of process gas. The upper electrode and the substrate support may be formed of any suitable material such as graphite, silicon, silicon carbide, aluminum (e.g., anodized aluminum), or combinations thereof. A heat transfer liquid source 174 can be connected to the upper electrode assembly 120 and another heat transfer liquid source can be connected to the substrate support 150.

The substrate support 150 can have one or more embedded clamping electrodes for electrostatically clamping a substrate on an upper surface 155 (support surface) of the substrate support 150. The substrate support 150 can be powered by an RF source and attendant circuitry (not shown) such as RF matching circuitry. The substrate support 150 is preferably temperature controlled and may optionally include a heating arrangement (not shown). Examples of heating arrangements are disclosed in commonly assigned U.S. Pat. Nos. 6,847,014 and 7,161,121, which are hereby incorporated by reference. The substrate support 150 can support a semiconductor substrate such as a flat panel or 200 mm or 300 mm wafer on the support surface 155.

The substrate support 150 preferably includes passages therein for supplying a heat transfer gas such as helium under the substrate supported on the support surface 155 to control the substrate temperature during plasma processing thereof. For example, helium back cooling can maintain wafer temperature low enough to prevent burning of photoresist on the substrate. A method of controlling a temperature of a substrate by introducing a pressurized gas into a space between the substrate and the substrate support surface is disclosed in commonly-owned U.S. Pat. No. 6,140,612, the disclosure of which is hereby incorporated by reference.

The substrate support 150 can include lift pin holes (not shown), through which lift pins can be actuated vertically by suitable mechanisms and raise the substrate off the support surface 155 for transport into and out from the chamber 110. The lift pin holes can have a diameter of about 0.08 inch.

Details of lift pin holes are disclosed in commonly owned U.S. Pat. Nos. 5,885,423 and 5,796,066, the disclosures of which is hereby incorporated by reference.

FIG. 2 shows a block diagram of a capacitively coupled plasma processing chamber 200 to illustrate flow path of RF current therein. A substrate 206 is being processed within processing chamber 200. To ignite the plasma for etching substrate 206, a process gas in the chamber 200 is subjected to RF power. RF current may flow from an RF supply 222 along a cable 224 through an RF match network 220 into processing chamber 200 during substrate processing. The RF current may travel along a path 240 to couple with the process gas to create plasma within a confined chamber volume 210 for processing substrate 206, which is positioned above a bottom electrode 204.

In order to control plasma formation and to protect the processing chamber walls, a confinement ring 212 may be employed. Details of an exemplary confinement ring are described in commonly owned U.S. Provisional Patent Application Ser. Nos. 61/238,656, 61/238,665, 61/238,670, all filed on Aug. 31, 2009, and U.S. Patent Application Publication No. 2008/0149596, the disclosures of which are hereby incorporated by reference. The confinement ring 212 may be made of a conductive material such as silicon, polysilicon, silicon carbide, boron carbide, ceramic, aluminum, and the like. Usually, the confinement ring 212 may be configured to surround the periphery of confined chamber volume 210 in which a plasma is to form. In addition to the confinement ring 212, the periphery of confined chamber volume 210 may also be defined by upper electrode 202, bottom electrode 204, one or more insulator rings such as 216 and 218, an edge ring 214 and a lower electrode support structure 228.

In order to exhaust neutral gas species from the confinement region (confined chamber volume 210), the confinement rings 212 may include a plurality of slots (such as slots 226a, 226b, and 226c). The neutral gas species may traverse from confined chamber volume 210 into an external region 232 (outside chamber volume) of processing chamber 200 before being pumped out of processing chamber 200 via a turbo pump 234.

The plasma formed during substrate processing should be kept within confined chamber volume 210. However, under certain conditions, plasma may be ignited outside of confined chamber volume 210. In an example, given a high pressurized environment, the neutral gas species (which are being exhausted from confined chamber volume 210 into external region 232 of processing chamber 200) may encounter an RF field. The existence of RF fields in the outside chamber may cause the formation of unconfined plasma 250.

In a typical processing environment, the RF current flows from an RF generator into confined chamber volume 210 and then to an electrical ground. A flow path of the RF current from the chamber volume 210 to the electrical ground is called an RF return path. With reference to FIG. 2, an RF return path 242 may include the RF return current flowing along the inside of set of confinement rings 212. At point 252, the RF return current may flow along the outside of confinement rings 212 to bridge with the inside wall surface of processing chamber 200. From the chamber wall. the RF return current may follow a set of straps 230 to lower electrode support structure 228. From the surface of lower electrode support structure 228, the RF return current may flow back to RF source 222 via RF match 220.

As can be seen from the foregoing, by following path 242, the RF current flows outside of confined chamber volume 210 on its way to the electrical ground. As a result, an RF field may be generated in the outside chamber region. The existence of such RF field may cause unconfined plasma 250 to be formed in external region 232 of processing chamber 200.

Accordingly, an arrangement for providing a short RF return path while preventing the ignition of unconfined plasma is desirable.

SUMMARY

Described herein is a movable ground ring of a movable substrate support assembly configured to fit around and provide an RF return path to a fixed ground ring of the movable substrate support assembly in an adjustable gap capacitively-coupled plasma processing chamber wherein a semiconductor substrate supported in the substrate support assembly undergoes plasma processing. The movable ground ring comprises: an annular bottom wall having a plurality of centering slots in a lower surface thereof; a sidewall extending upwardly from an inner periphery of the bottom wall, the sidewall having an inner surface configured to surround an outer periphery of the fixed ground ring such that the movable ground ring is movable vertically with respect to the fixed ground ring.

BRIEF DESCRIPTION OF FIGURES

FIGS. 4A-4I show details of a movable ground ring of the movable substrate support assembly, according to an embodiment.

FIGS. 6A-6C show details of a quartz ring with a plurality of recesses which mounts on the upper inner edge of the movable ground ring.

DETAILED DESCRIPTION

Figure 1:
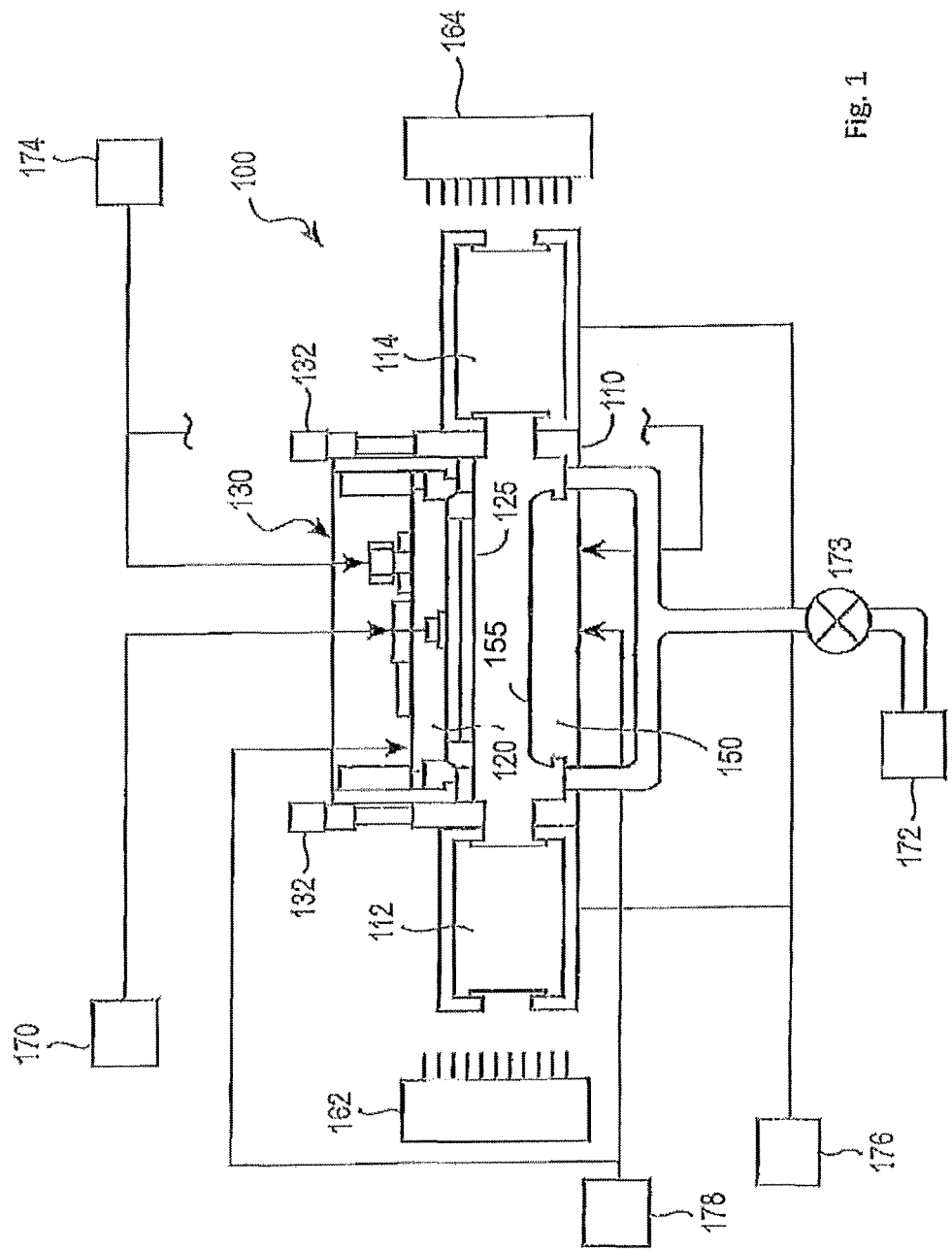
FIG. 1 shows a schematic of an exemplary plasma processing chamber.
Figure 2:
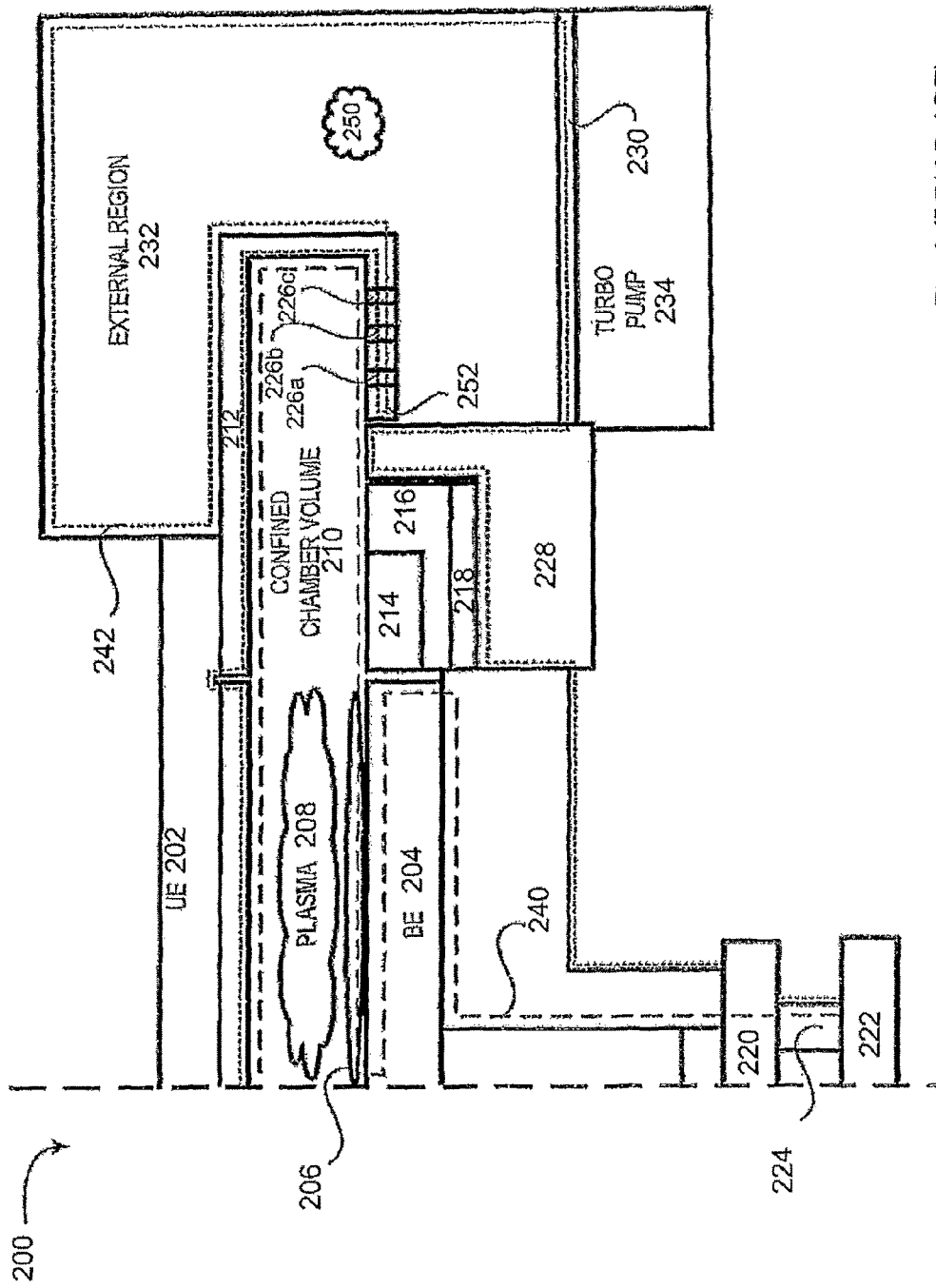
FIG. 2 shows a block diagram of a capacitively coupled plasma processing chamber and an RF return path therein.
Figure 3A:
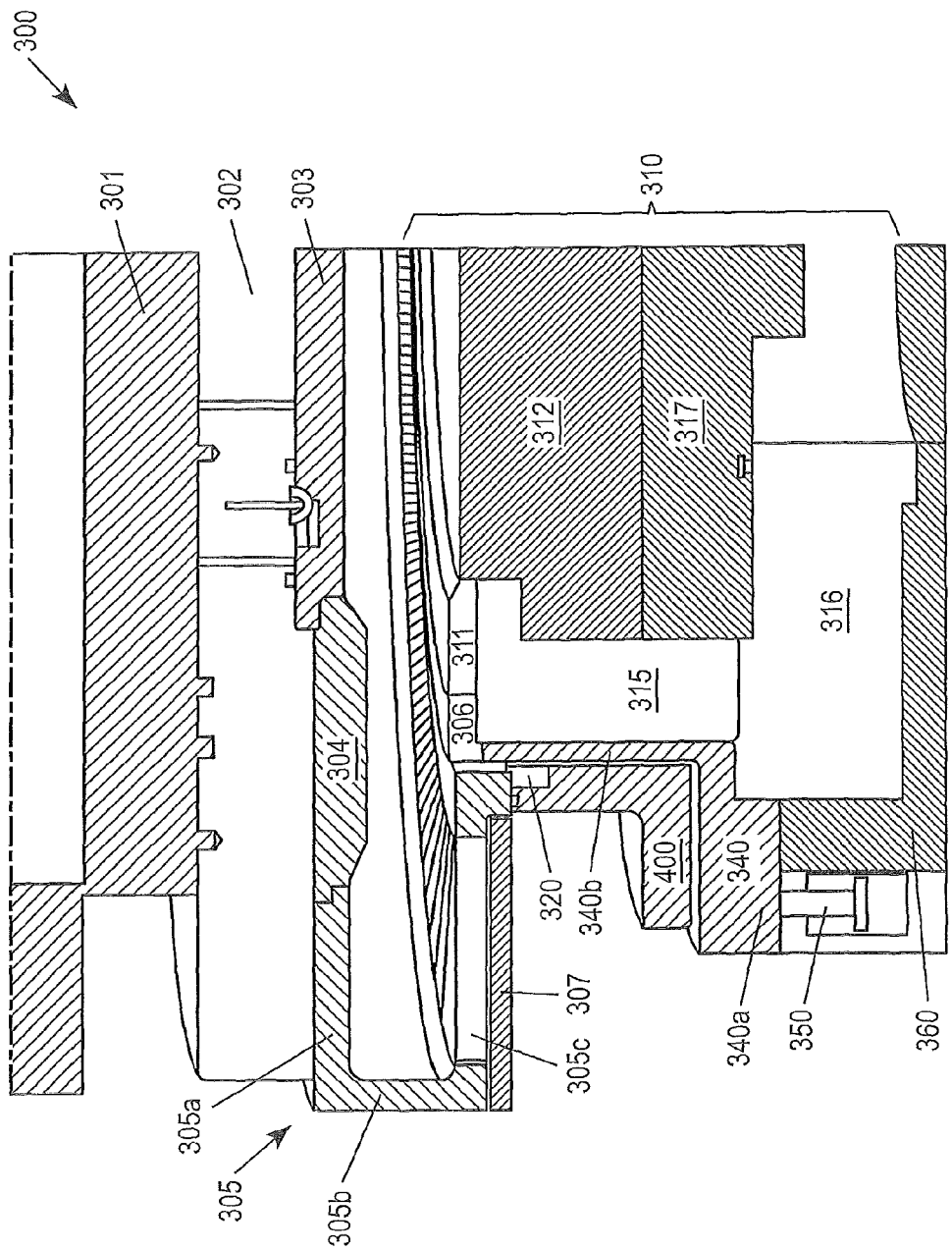
FIG. 3A shows a partial cross section of an exemplary adjustable gap capacitively-coupled plasma processing chamber when a movable substrate support assembly thereof is in an upper position.
Figure 3B:
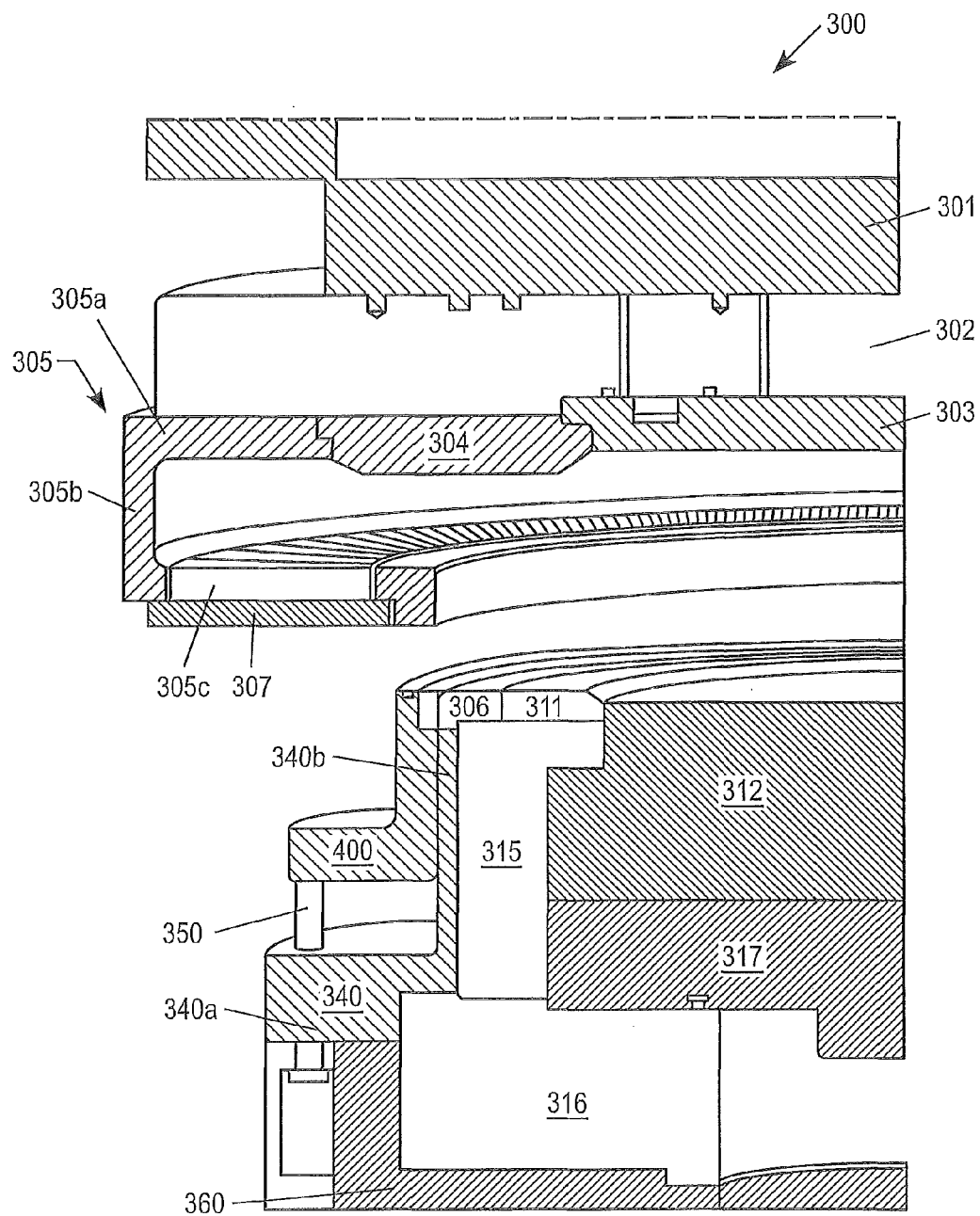
FIG. 3B shows a partial cross section of the exemplary adjustable gap capacitively-coupled plasma processing chamber of FIG. 3A wherein a movable substrate support assembly thereof is in a lower position.

Described herein is a movable ground ring configured to fit around and provide an RF return path to a fixed ground ring of a movable substrate support assembly in an adjustable gap capacitively-coupled plasma processing chamber. FIGS. 3A and 3B show a partial cross section of an exemplary adjustable gap capacitively-coupled plasma processing chamber 300. The chamber 300 comprises a movable substrate support assembly 310, an upper electrode including a center electrode plate 303 and an annular outer electrode 304 and an electrically conductive confinement ring 305 extending outwardly from the annular outer electrode 304, the confinement ring 305 including an upper horizontal section 305a, a vertical section 305b extending downwardly from an outer end of the upper horizontal section 305a and a lower horizontal section 305c extending inwardly from a lower end of the vertical section 305b, the lower horizontal section 305c including radially extending slots through which process gas and reaction byproducts are pumped out of the plasma processing chamber 300. A lower surface of an inner end of the lower horizontal section 305c provides electrical contact with an upper end of a movable ground ring 400 when the movable substrate support assembly 310 is in an upper position as shown in FIG. 3A. The lower surface of an inner end of the lower horizontal section 305c preferably includes an electrically conductive coating adapted to enhance electrical contact with the movable ground ring 400. Plasma processing of a semiconductor substrate supported on the movable substrate support assembly 310 is carried out when the movable substrate support assembly 310 is at the upper position. The confinement ring 305 can includes at least one slotted ring 307 below the lower horizontal section 305c, the slotted ring 307 being rotatable and vertically movable with respect to the lower horizontal section 305c to adjust gas flow conductance through the radially extending slots. FIG. 3B shows a lower position of the movable substrate support assembly 310 at which a semiconductor substrate can be transferred onto the movable substrate support assembly 310.

The movable substrate support assembly 310 comprises the movable ground ring 400, a lower electrode 317, an electrostatic chuck (ESC) 312 on which a semiconductor substrate is electrostatically clamped, an edge ring 311 having a plasma exposed surface surrounding the ESC 312, a dielectric ring 306 having a plasma exposed surface surrounding the edge ring 311, at least one insulator ring 315 beneath the edge ring 311, a fixed ground ring 340 of electrically conductive material beneath the dielectric ring 306 and surrounding the insulator ring. The movable ground ring 400 is supported on depressible plungers 350 supported on the fixed ground ring 340. The movable ground ring 400 is movable vertically with respect to the fixed ground ring 340 so as to make electrical contact with the confinement ring 305 when the movable substrate support assembly 310 is moved to the upper position. The movable substrate support assembly 310 can be supported on an electrically grounded bias housing 360.

Figure 3C:
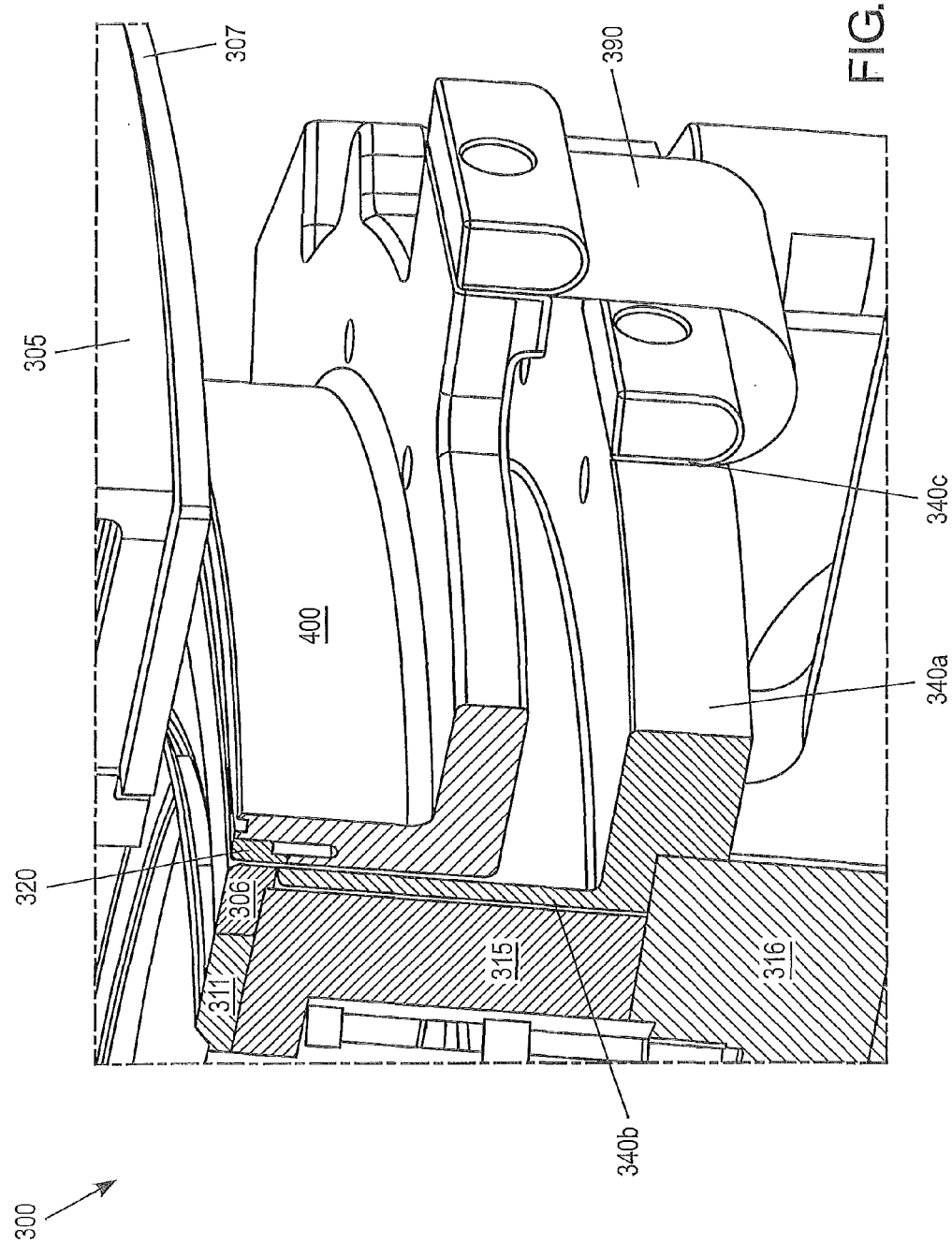
FIG. 3C shows a partial perspective view of the exemplary adjustable gap capacitively-coupled plasma processing chamber of FIG. 3A wherein a movable substrate support assembly thereof is in the lower position.

The fixed ground ring 340 can include a bottom wall 340a and a sidewall 340b extending upwardly from an inner periphery of the bottom wall 340a. The sidewall 340b has an outer diameter no larger than an outer diameter of the dielectric ring 306. As shown in FIG. 3C, the bottom wall 340a of the fixed ground ring 340 preferably includes eight circumferentially spaced apart RF return strap connections 340c for flexible RF return straps 390 between the fixed ground ring 340 and the movable ground ring 400 which provide RF return paths therebetween. An RF gasket between the movable ground ring 400 and the fixed ground ring 340 can be used instead of the straps 390 to create a sliding RF contact as part of the RF return paths.

The fixed ground ring 340 can include three plunger support bores circumferentially spaced apart in an outer portion of the bottom wall, each of the plunger support bores engaging a plunger support housing containing depressible pins such that upper ends of the pins extend above an upper surface of the bottom wall.

FIGS. 4A-4I show details of the movable ground ring 400 according to an embodiment. The movable ground ring 400 comprises an annular bottom wall 402 and a sidewall 401 extending upwardly from an inner periphery of the bottom wall 402. The side wall 401 has an inner surface 401a configured to surround an outer periphery of the fixed ground ring 340 such that the movable ground ring 400 is movable vertically with respect to the fixed ground ring 340. The inner surface 401a has a diameter up to 0.04 inch larger than an outer diameter of a sidewall of the fixed ground ring 340, preferably up to 0.03 inch larger.

The movable ground ring 400 has a plurality of centering slots 403 in its lower surface 402a (FIG. 4C). The slots 403 are azimuthally spaced. Preferably, the movable ground ring 400 has three centering slots 403 spaced by 120°. Preferably, the centering slots 403 are elongated along a radial line passing through a center axis of the movable ground ring 400 and have a V-shaped cross section. FIG. 4D shows a top view of one of the slots 403. FIG. 4E shows a cross section of one of the slots 403 along the radial line. FIG. 4F shows a cross section of one of the slots 403 perpendicular to the radial line. The slots 403 preferably have opening angles of 45 to 90°, preferably about 60° in all directions.

The movable ground ring 400 has a plurality of RF return strap connections. RF return straps 390 can be attached to the RF return strap connections and electrically ground the movable ground ring 400 to the fixed ground ring 340. Preferably, the RF return strap connections comprise eight radially outwardly extending projections 488 on an outer periphery of the bottom wall 402.

Figure 4A:
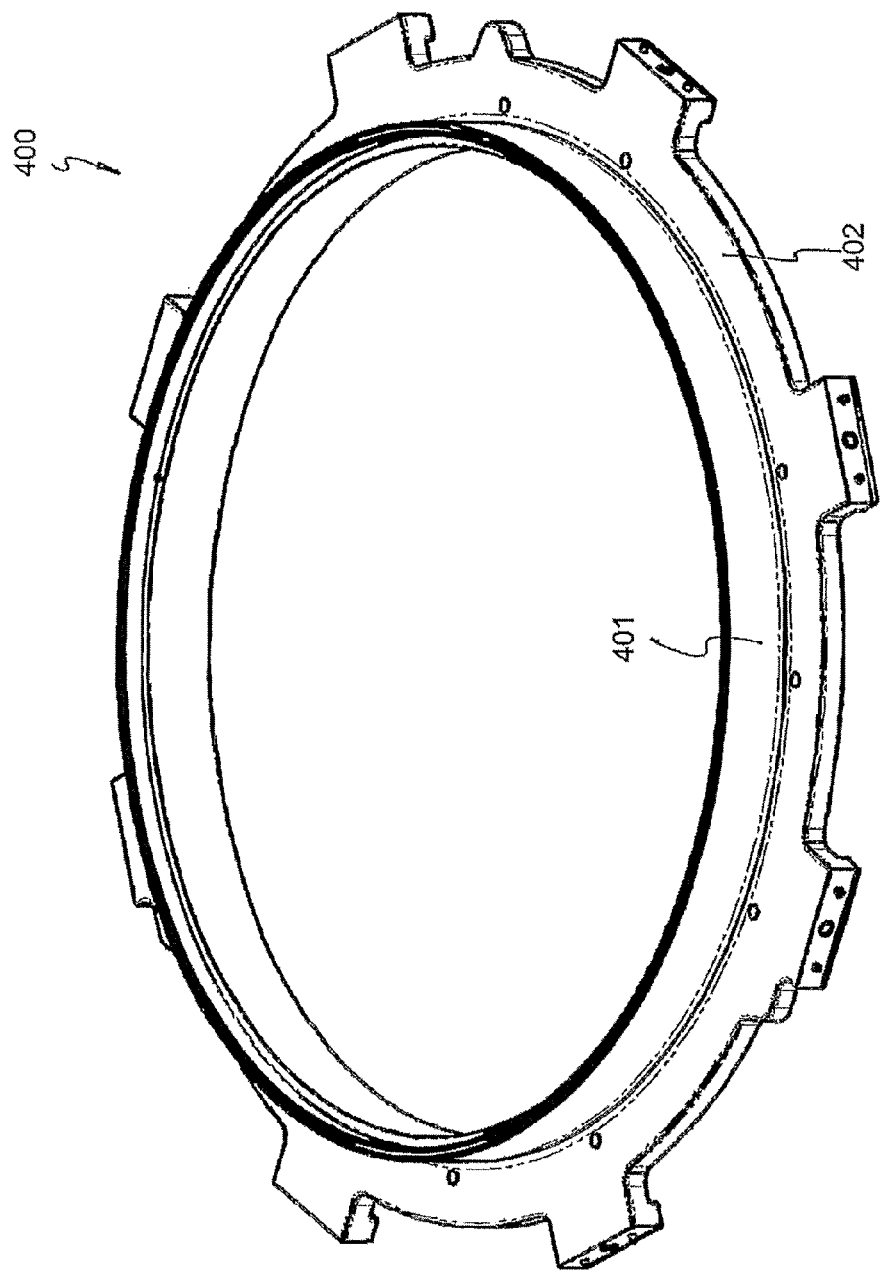
Figure 4B:
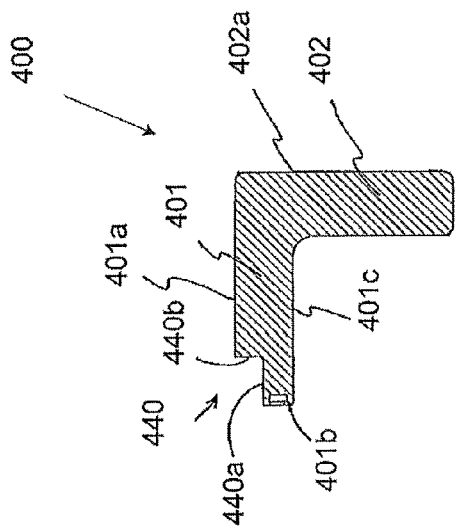
Figure 4H:
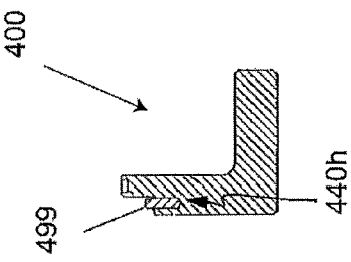
Figure 4G:
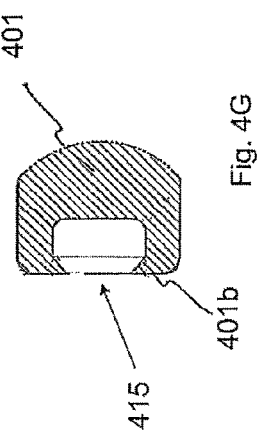
Figure 4I:
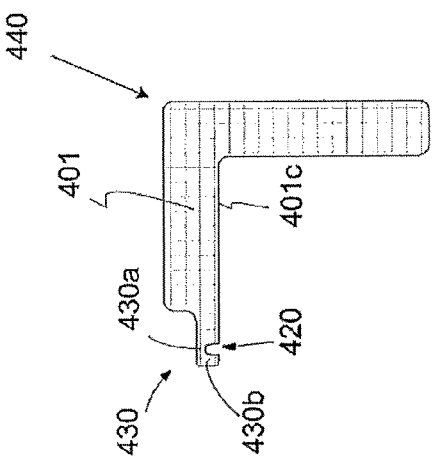

The movable ground ring 400 can have an annular recess 415, extending vertically into an upper surface 401b of the sidewall 401 (FIG. 4G). The recess 415 is configured to receive an RF gasket. Alternatively, the movable ground ring 400 does not have the recess 415 but an upper end of the sidewall 401 includes an annular slot 420 extending into an outer surface 401c of the sidewall 401 to form a flexure 430 comprising a vertically extending thin wall section 430a and deflectable annular section 430b extending radially outward from an upper end of the thin wall section 430a (FIG. 4I). The RF gasket or the flexure 430 are functional to resiliently engage the confinement ring 305 along an entire upper perimeter of the sidewall 401. The RF gasket and the flexure are functional to accommodate unplanarity between the movable ground ring 400 and the confinement ring 305 and ensure electrical contact therebetween along the entire perimeter.

As shown in FIG. 4B, the movable ground ring 400 preferably has in the inner surface 401a a step 440 formed by a vertical surface 440a extending from the upper surface 401b of the sidewall 401 and a horizontal surface 440b extending between the inner surface 401a and the vertical surface 440a. As shown in FIG. 4H, the horizontal surface 440b includes a plurality of blind holes 440h adapted to receive vertical pins 499 which mate with alignment holes in a lower surface of a consumable quartz ring 320 (not shown in FIG. 4H, shown in FIGS. 3A-3C) adapted to separate the upper end of the sidewall 401 from the dielectric ring 306 when the movable substrate support assembly 310 is at the lower position.

Figure 5A:
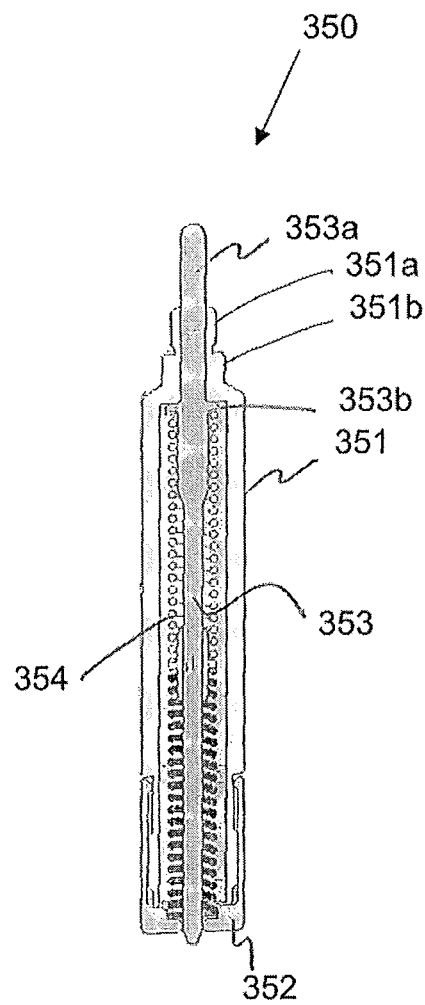
FIG. 5A shows a cross section of a depressible plunger which supports the movable ground ring.
Figure 5B:
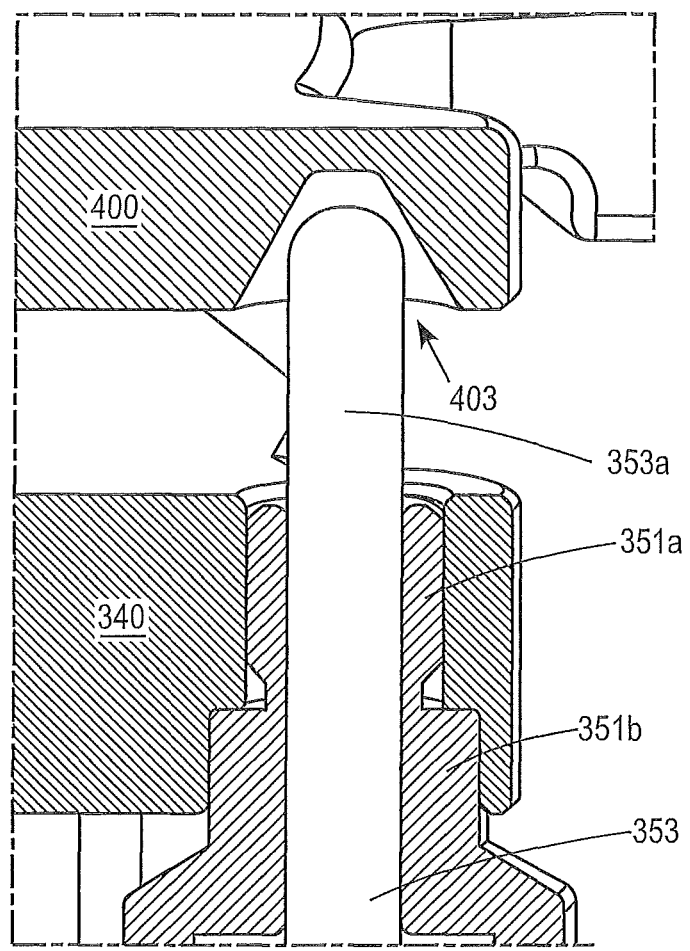
FIG. 5B shows a cross section of a depressible plunger mounted in a fixed ground ring.

As shown in FIGS. 5A-5B, each of the depressible plungers 350 comprises a housing 351, a cap 352 enclosing a lower end of the housing 351 and a spring biased pin 353 in the housing 351, the pin 353 including an upper portion 353a extending out an upper end 351a of the housing 351 and configured to engage a respective one of the centering slots 403 in the movable ground ring 400, the pin 353 including a flange 353b which limits upward travel of the pin 353 and the flange 353b engaging a spring 354 which biases the pin 353 upwardly, the pin 353 being depressible during upward movement of the substrate support assembly 310 when the upper end of the movable ground ring 400 makes electrical contact with the confinement ring 350. When the movable substrate support assembly 310 is at the upper position, the pin 353 is preferably loaded at a force of 301b or more by the spring 354 to ensure reliable electrical connection between the movable ground ring 400 and the confinement ring 305.

As shown in FIG. 5B, the upper end 351a of the housing 351 includes a small diameter threaded section engaged in a threaded opening in the fixed ground ring 340 and a larger diameter section 351b received in a mating opening in the fixed ground ring 340. The upper end 353a of the pin 353 is preferably depressible at least 0.5 inch with respect to the upper end 351a of the housing 351.

As shown in FIGS. 3A, 3B and 4H, the quartz ring 320 including a plurality of centering recesses 321 in a lower surface thereof. The recesses 321 are configured to receive the vertical pins 499 extending from blind holes 440h in the horizontal surface 440b of the step 440, each of the vertical pins 499 located in a respective one of the centering recesses 321.

Figure 6C:
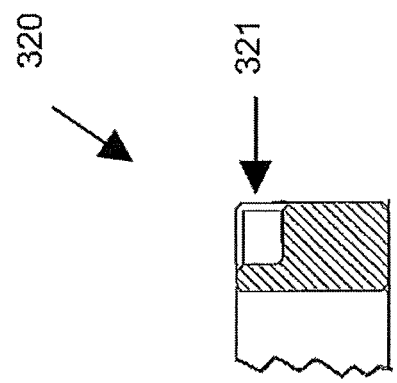
Figure 6B:
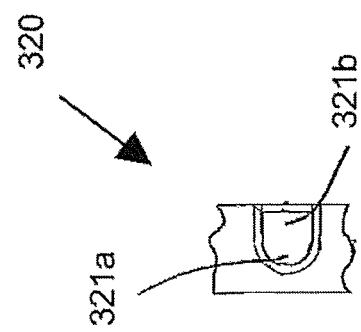

In one embodiment, as shown in FIGS. 6A-6C, the quartz ring 320 has a rectangular cross section with an inner diameter of about 14.8 inches, an outer diameter of about 15.1 inches, and a height of about 0.3 inch. Three recesses 321 azimuthally spaced by 120° are disposed in a lower outer corner of the quartz ring 320. Each recess 321 has a semi-cylindrical portion 321a with a diameter of about 0.1 inch. A center axis of the semi-cylindrical portion 321a is located at a radius of about 7.5 inches from a center axis of the quartz ring 320. The semi-cylindrical portion 321a is connected with a straight portion 321b open on an outer surface of the quartz ring 320. The straight portion 321b has a width equal to the diameter of the semi-cylindrical portion 321a. The recess 321 has a depth of about 0.09 inch. All edges of the recess 321 preferably have a 45° chamfer of about 0.02 inch wide. The recesses 321 are configured to accommodate difference between the thermal expansion coefficients of the quartz ring 320 and the movable ground ring 400, which is preferably made of aluminum, and centrally align the quartz ring 320 to the movable ground ring 400 in a temperature range they are exposed to.

A method of processing a semiconductor substrate in the adjustable gap plasma processing chamber comprises moving the movable substrate support assembly 310 to the lower position, transferring a semiconductor substrate onto the ESC 312, moving the movable substrate support assembly 310 to the upper position, supplying process gas to the gap between the upper electrode (303 and 304) and the ESC 312, supplying RF energy to at least one of the upper and lower electrodes so as to energize the process gas into a plasma state, and processing (e.g. plasma etching) the semiconductor substrate with the plasma.

Preferably, during movement of the movable substrate support assembly 310 from the lower position to the upper position the movable ground ring 400 moves vertically until an upper end thereof comes into electrical contact with the lower horizontal section 305c of the confinement ring 305, after which the movable ground ring 400 depresses the depressible plungers 350 supported on the fixed ground ring 340 until the movable substrate support assembly 310 reaches the upper position providing a desired gap width.

The movable ground ring eliminates the need for a wafer port through the confinement ring 305. Such a wafer port can to lead to plasma etch non-uniformity and plasma unconfinement.

While the movable ground ring, movable substrate support assembly and adjustable gap capacitively-coupled plasma processing chamber therein have been described in detail with reference to specific embodiments thereof, it will be apparent to those skilled in the art that various changes and modifications can be made, and equivalents employed, without departing from the scope of the appended claims.

We claim:

1. A movable ground ring of a movable substrate support assembly configured to fit around and provide an RF return path to a fixed ground ring of the movable substrate support assembly in an adjustable gap capacitively-coupled plasma processing chamber wherein a semiconductor substrate supported in the substrate support assembly undergoes plasma processing, the movable ground ring comprising:
an annular bottom wall having a plurality of centering slots in a lower surface thereof;
a sidewall extending upwardly from an inner periphery of the bottom wall, the sidewall having an inner surface configured to surround an outer periphery of the fixed ground ring such that the movable ground ring is movable vertically with respect to the fixed ground ring.

2. The movable ground ring of claim 1, wherein the plurality of centering slots comprises three elongated V-shaped slots each of which extends along a radial line passing through a center axis of the movable ground ring.

3. The movable ground ring of claim 1, further comprising a plurality of RF return strap connections on the bottom wall wherein the plurality of RF return strap connections comprises eight radially outwardly extending projections on an outer periphery of the bottom wall.

4. The movable ground ring of claim 1, wherein an upper surface of the sidewall includes an annular recess configured to receive an RF gasket.

5. The movable ground ring of claim 1, wherein an upper end of the sidewall includes an annular slot extending into an outer surface of the sidewall to form a flexure comprising a vertically extending thin wall section and deflectable annular section extending radially outward from an upper end of the thin wall section.

6. The movable ground ring of claim 1, wherein the inner surface includes a step formed by a vertical surface extending from the upper surface of the sidewall and a horizontal surface extending between the inner surface and the vertical surface, the horizontal surface including a plurality of blind holes adapted to receive pins which mate with alignment holes in a lower surface of a quartz ring adapted to separate the upper end of the sidewall from a dielectric ring at the outer upper end of the substrate support assembly.

7. A substrate support assembly comprising the movable ground ring of claim 1, the substrate support assembly including a lower electrode, an ESC on which the semiconductor substrate is electrostatically clamped, an edge ring having a plasma exposed surface surrounding the ESC, a dielectric ring having a plasma exposed surface surrounding the edge ring, at least one insulator ring beneath the edge ring, a fixed ground ring of electrically conductive material beneath the dielectric ring and surrounding the insulator ring, the inner surface of the sidewall having a diameter up to 0.04 inch larger than an outer diameter of a sidewall of the fixed ground ring, the movable ground ring supported on depressible plungers supported on the fixed ground ring, the movable ground ring being movable vertically with respect to the fixed ground ring so as to make electrical contact with a confinement ring forming an inner wall of a plasma confinement zone when the substrate support assembly is moved to an upper position at which the semiconductor substrate is processed in the plasma processing chamber.

8. The substrate support assembly of claim 7, wherein each of the depressible plungers comprises a housing, a cap enclosing a lower end of the housing and a spring biased pin in the housing, the pin including an upper portion extending out an upper end of the housing and configured to engage a respective one of the centering slots in the movable ground ring, the pin including a flange which limits upward travel of the pin and the flange engaging a spring which biases the pin upwardly, the pin being depressible when the upper end of the movable ground ring makes electrical contact with the confinement ring.

9. The substrate support assembly of claim 8, wherein the upper end of the housing includes a small diameter threaded section engaged in a threaded opening in the fixed ground ring and a larger diameter section received in a mating opening in the fixed ground ring.

10. The substrate support assembly of claim 7, wherein upper ends of the pins are movable at least 0.5 inch with respect to the upper end of the housing.

11. An adjustable gap plasma processing chamber comprising the substrate support assembly of claim 7, wherein the substrate support assembly is movable from a lower position at which a semiconductor substrate can be transferred onto an upper surface of the ESC to an upper position at which plasma processing of the semiconductor substrate is carried out, the plasma processing chamber including an upper electrode and an electrically conductive confinement ring extending outwardly from the upper electrode, the confinement ring including an upper horizontal section, a vertical section extending downwardly from an outer end of the upper horizontal section and a lower horizontal section extending inwardly from a lower end of the vertical section, the lower horizontal section including radially extending slots through which process gas and reaction byproducts are pumped out of the plasma confinement zone, a lower surface of an inner end of the lower horizontal section providing electrical contact with the upper end of the movable ground ring when the substrate support assembly is in the upper position to adjust a gap between the upper and lower electrodes.

12. The adjustable gap plasma processing chamber of claim 11, wherein the lower surface of the inner end of the lower horizontal section of the confinement ring includes an electrically conductive coating adapted to enhance electrical contact with the movable ground ring.

13. The adjustable gap plasma processing chamber of claim 11, wherein a plurality of flexible RF return straps extend between the movable ground ring and the fixed ground ring.

14. The adjustable gap plasma processing chamber of claim 11, wherein a quartz ring is located in a step formed by a vertical surface extending from the upper surface of the sidewall of the movable ground ring and a horizontal surface extending between the inner surface and the vertical surface, the quartz ring including a plurality of centering recesses in a lower surface thereof, the movable ground ring including a plurality of vertical pins extending from blind holes in the horizontal surface of the step, each of the vertical pins located in a respective one of the centering recesses.

15. The adjustable gap plasma processing chamber of claim 11, wherein an RF gasket is located in an annular recess in an upper end of the sidewall of the movable ground ring.

16. The adjustable gap plasma processing chamber of claim 11, wherein the confinement ring includes a slotted ring below the lower horizontal section, the slotted ring being rotatable and vertically movable with respect to the lower horizontal section to adjust gas flow conductance through radially extending aligned slots of the lower horizontal section and the slotted ring.

17. The adjustable gap plasma processing chamber of claim 11, wherein the fixed ground ring includes a bottom wall and a sidewall extending upwardly from an inner periphery of the bottom wall, the sidewall of the fixed support ring having an outer diameter no larger than an outer diameter of the dielectric ring, the bottom wall of the fixed ground ring including eight circumferentially spaced apart RF return strap connections, the movable ground ring including eight circumferentially spaced apart RF return strap connections, and eight flexible RF return straps providing electrical return paths between the RF return strap connections of the movable ground ring and the fixed ground ring.

18. The adjustable gap plasma processing chamber of claim 17, wherein the fixed ground ring includes three plunger support bores circumferentially spaced apart in an outer portion of the bottom wall, each of the plunger support bores engaging a plunger support housing containing depressible pins such that upper ends of the pins extend above an upper surface of the bottom wall.

19. A method of processing a semiconductor substrate in the adjustable gap plasma processing chamber of claim 11, comprising moving the substrate support assembly to the lower position, transferring a semiconductor substrate onto the ESC, moving the substrate support assembly to the upper position, supplying process gas to the gap between the upper electrode and the ESC, supplying RF energy to at least one of the upper and lower electrodes so as to energize the process gas into a plasma state, and processing the semiconductor substrate with the plasma.

20. The method of claim 19, wherein during movement of the substrate support assembly from the lower position to the upper position the movable ground ring moves vertically until an upper end thereof comes into electrical contact with the lower horizontal section of the confinement ring, after which the movable ground ring depresses the depressible plungers supported on the fixed ground ring until the substrate support assembly reaches the upper position.

* * * * *